(12) United States Patent
Niu et al.

(10) Patent No.: US 7,985,454 B2
(45) Date of Patent: Jul. 26, 2011

(54) SYSTEMS AND METHODS FOR NANOWIRE GROWTH AND MANUFACTURING

(75) Inventors: Chunming Niu, Palo Alto, CA (US); Jay L. Goldman, Mountain View, CA (US); Xiangfeng Duan, Los Angeles, CA (US); Vijendra Sahi, Menlo Park, CA (US)

(73) Assignee: Nanosys, Inc., Palo Alto, CA (US)

( * ) Notice: Subject to any disclaimer, the term of this patent is extended or adjusted under 35 U.S.C. 154(b) by 332 days.

(21) Appl. No.: 12/236,209

(22) Filed: Sep. 23, 2008

(65) Prior Publication Data

US 2010/0279513 A1 Nov. 4, 2010

Related U.S. Application Data

(62) Division of application No. 11/103,642, filed on Apr. 12, 2005, now abandoned.

(60) Provisional application No. 60/566,602, filed on Apr. 30, 2004.

(51) Int. Cl.
 *B05D 1/38* (2006.01)
(52) U.S. Cl. .......... 427/475; 427/240; 427/250
(58) Field of Classification Search .......... 427/475, 427/240, 250
See application file for complete search history.

(56) References Cited

U.S. PATENT DOCUMENTS

| | | |
|---|---|---|
| 5,196,396 A | 3/1993 | Lieber et al. |
| 5,252,835 A | 10/1993 | Lieber et al. |
| 5,274,602 A | 12/1993 | Glen et al. |
| 5,332,910 A | 7/1994 | Haraguchi et al. |
| 5,338,430 A | 8/1994 | Parsonage et al. |
| 5,505,928 A | 4/1996 | Alivisatos et al. |
| 5,512,131 A | 4/1996 | Kumar et al. |
| 5,640,343 A | 6/1997 | Gallagher et al. |
| 5,674,592 A | 10/1997 | Clark et al. |
| 5,690,807 A | 11/1997 | Clark, Jr. et al. |
| 5,751,018 A | 5/1998 | Alivisatos et al. |
| 5,840,435 A | 11/1998 | Lieber et al. |
| 5,858,862 A | 1/1999 | Westwater et al. |
| 5,897,945 A | 4/1999 | Lieber et al. |
| 5,953,595 A | 9/1999 | Gosain et al. |
| 5,962,863 A | 10/1999 | Russell et al. |

(Continued)

FOREIGN PATENT DOCUMENTS

WO 9629629 9/1996

(Continued)

OTHER PUBLICATIONS

Zhou, C. et al., "Nanoscale metal/self-assembled monolayer/metal heterostructures" Applied Phys. Lett (1997) 71:611-613.

(Continued)

*Primary Examiner* — Frederick J Parker
(74) *Attorney, Agent, or Firm* — Andrew L. Filler

(57) ABSTRACT

The present invention is directed to compositions of matter, systems, and methods to manufacture nanowires. In an embodiment, a method to produce a catalytic-coated nanowire growth substrate for nanowire growth is disclosed which comprises: (a) depositing a buffer layer on a substrate; (b) treating the buffer layer with boiled water or steam to enhance interactions between the buffer layer and catalyst particles; and (c) depositing catalytic particles on a surface of the buffer layer. Methods to develop and use this catalytic-coated nanowire growth substrate are disclosed.

15 Claims, 13 Drawing Sheets

300

U.S. PATENT DOCUMENTS

| | | | |
|---|---|---|---|
| 5,976,957 A | 11/1999 | Westwater et al. | |
| 5,990,479 A | 11/1999 | Weiss et al. | |
| 5,997,832 A | 12/1999 | Lieber et al. | |
| 6,004,444 A | 12/1999 | Aksay et al. | |
| 6,036,774 A | 3/2000 | Lieber et al. | |
| 6,048,616 A | 4/2000 | Gallagher et al. | |
| 6,128,214 A | 10/2000 | Kuekes et al. | |
| 6,132,874 A | 10/2000 | Fischer et al. | |
| 6,136,156 A | 10/2000 | El-Shall et al. | |
| 6,159,742 A | 12/2000 | Lieber et al. | |
| 6,190,634 B1 | 2/2001 | Lieber et al. | |
| 6,207,229 B1 | 3/2001 | Bawendi et al. | |
| 6,225,198 B1 | 5/2001 | Alivisatos et al. | |
| 6,235,675 B1 | 5/2001 | McIlroy | |
| 6,248,674 B1 | 6/2001 | Kamins et al. | |
| 6,256,767 B1 | 7/2001 | Kuekes et al. | |
| 6,274,007 B1 | 8/2001 | Smirnov et al. | |
| 6,306,736 B1 | 10/2001 | Alivisatos et al. | |
| 6,322,901 B1 | 11/2001 | Bawendi et al. | |
| 6,380,103 B2 | 4/2002 | Gonzalez et al. | |
| 6,383,923 B1 | 5/2002 | Brown et al. | |
| 6,413,489 B1 | 7/2002 | Ying et al. | |
| 6,438,025 B1 | 8/2002 | Skarupo | |
| 6,447,663 B1 | 9/2002 | Lee et al. | |
| 6,471,761 B2 | 10/2002 | Fan et al. | |
| 6,566,704 B2 | 5/2003 | Choi et al. | |
| 6,586,785 B2 | 7/2003 | Flagan et al. | |
| 6,760,245 B2 | 7/2004 | Eaton et al. | |
| 6,773,616 B1 | 8/2004 | Chen et al. | |
| 6,798,000 B2 | 9/2004 | Luyken et al. | |
| 6,808,605 B2 * | 10/2004 | Lee et al. | 204/192.15 |
| 6,815,218 B1 | 11/2004 | Jacobsen et al. | |
| 6,815,750 B1 | 11/2004 | Kamins | |
| 6,831,017 B1 | 12/2004 | Li et al. | |
| 6,858,455 B2 | 2/2005 | Guillom et al. | |
| 6,872,645 B2 | 3/2005 | Duan et al. | |
| 6,878,871 B2 | 4/2005 | Scher et al. | |
| 6,882,051 B2 | 4/2005 | Majumdar et al. | |
| 2001/0023986 A1 | 9/2001 | Mancevski | |
| 2002/0004136 A1 | 1/2002 | Gao et al. | |
| 2002/0014667 A1 | 2/2002 | Shin et al. | |
| 2002/0072577 A1 | 6/2002 | Jacobsen et al. | |
| 2002/0117659 A1 | 8/2002 | Lieber et al. | |
| 2002/0125192 A1 | 9/2002 | Lopez et al. | |
| 2002/0127495 A1 | 9/2002 | Scherer | |
| 2002/0130311 A1 | 9/2002 | Lieber et al. | |
| 2002/0130353 A1 | 9/2002 | Lieber et al. | |
| 2002/0158342 A1 | 10/2002 | Tuominen et al. | |
| 2002/0163079 A1 | 11/2002 | Awano | |
| 2002/0175408 A1 | 11/2002 | Majumdar et al. | |
| 2003/0012723 A1 | 1/2003 | Clarke | |
| 2003/0042562 A1 | 3/2003 | Giebeler et al. | |
| 2003/0044777 A1 | 3/2003 | Beattie | |
| 2003/0071246 A1 | 4/2003 | Grigorov | |
| 2003/0089899 A1 | 5/2003 | Lieber et al. | |
| 2003/0186522 A1 | 10/2003 | Duan et al. | |
| 2003/0189202 A1 | 10/2003 | Li et al. | |
| 2004/0005258 A1 | 1/2004 | Fonash et al. | |
| 2004/0005723 A1 | 1/2004 | Empedocles et al. | |
| 2004/0026684 A1 | 2/2004 | Empedocles | |
| 2004/0031975 A1 | 2/2004 | Kern et al. | |
| 2004/0036126 A1 | 2/2004 | Chau et al. | |
| 2004/0036128 A1 | 2/2004 | Zhang et al. | |
| 2004/0061422 A1 | 4/2004 | Avouris et al. | |
| 2004/0063839 A1 | 4/2004 | Kawate et al. | |
| 2004/0095658 A1 | 5/2004 | Buretea et al. | |
| 2004/0112964 A1 | 6/2004 | Empedocles et al. | |
| 2004/0135951 A1 | 7/2004 | Stumbo et al. | |
| 2004/0146560 A1 | 7/2004 | Whiteford et al. | |
| 2005/0029678 A1 * | 2/2005 | Hanrath et al. | 257/784 |
| 2005/0064618 A1 | 3/2005 | Brown et al. | |
| 2005/0066883 A1 | 3/2005 | Dubrow et al. | |
| 2005/0079659 A1 | 4/2005 | Duan et al. | |
| 2005/0167655 A1 | 8/2005 | Furukawa et al. | |
| 2005/0279274 A1 | 12/2005 | Niu et al. | |

FOREIGN PATENT DOCUMENTS

| | | |
|---|---|---|
| WO | 0103208 | 1/2001 |
| WO | 0217362 | 2/2002 |
| WO | 0248701 | 6/2002 |
| WO | 02080280 | 10/2002 |
| WO | 03085700 | 10/2003 |
| WO | 03085701 | 10/2003 |
| WO | 2004032191 | 4/2004 |
| WO | 2004032193 | 4/2004 |
| WO | 2005-023923 | 3/2005 |

OTHER PUBLICATIONS

Bachtold, A. et al., "Logic Circuits with Carbon Nanotube Transistors" Science (2001) 294:1317-1320.

Bjork, M.T. et al. "One-dimensional steeplechase for electrons realized" Nano Letters (2002) 2:86-90.

Cao, Y. et al. "Growth and properties of semiconductor core/shell nanocrystals with InAs cores" J. Am. Chem. Soc. (2000) 122:9692-9702.

Chen, J. et al., "Observation of a Large On-Off Ratio and Negative Differential Resistance in an Electronic Molecular Switch" Science (1999) 286:1550-1552.

Chung, S-W. et al., "Silicon Nanowire Devices" App. Phys. Letts. (2000) 76(15):2068-2070.

Collier, C.P. et al., "Electronically Configurable Molecular-Based Logic Gates" Science (1999) 285:391-394.

Cui, Y. et al. "Doping and electrical transport in silicon nanowires" J. Phys. Chem. B (2000) 104:5213-5216.

Cui, Y. et al. "Diameter-controlled synthesis of single-crystal silicon nanowires" Appl. Phys. Lett. (2001) 78:2214-2216.

Cui, Y. et al., "Functional Nanoscale electronic devices assembled using silicon nanowire building blocks" Science (2001) 291:851-853.

Dabbousi, B.O. et al. "(CdSe)ZnS core-shell quantum dots: Synthesis and characterization of a size series of highly luminescent nanocrysallites" J. Phys. Chem. B (1997) 101:9463-9475.

De Los Arcos, T. et al. "Is aluminum a suitable buffer layer for carbon nanotube growth?" Chem Phys Letts (2003) 380:419-423.

Derycke, V. et al., "Carbon Nanotube Inter-and Intramolecular Logic Gates" Nano Letters (2001) 1(9):453-456.

Duan, X. et al., "General synthesis of compound semiconductor nanowires" Adv. Mater. (2000) 12:298-302.

Duan, X. et al., "High performance thin-film transistors using semiconductor nanowires and nanoribbons" Nature (2003) 425:274-278.

Greene, L. et al. "Low-temperature wafer scale production of ZnO nanowire arrays", Angew. Chem. Int. Ed. (2003) 42:3031-3034.

Givargizov, E.I. "Fundamental Aspects of VLS Growth" J. Cryst. Growth (1975) 31:20-30.

Gudiksen, M.S. et al "Diameter-selective synthesis of semiconductor nanowires" J. Am. Chem. Soc. (2000) 122:8801-8802.

Gudiksen, M.S. et al. "Synthetic control of the diameter and length of single crystal semiconductor nanowires" J. Phys. Chem. B (2001) 105:4062-4064.

Gudiksen, M.S. et al. "Growth of nanowire superlattice structures for nanoscale photonics and electronics" Nature (2002) 415:617-620.

Haraguchi, K. et al., "Polarization Dependence of Ligh Emitted from GaAs p-n junctions in quantum wire crystals" J. Appl. Phys. (1994) 75(8):4220-4225.

Haraguchi, K. et al., "Self Organized Fabrication of Planar GaAs Nanowhisker Arrays" Appl. Phys. Lett. (1996) 69(3):386-387.

Hiruma, K. et al., "GaAs Free Standing Quantum Sized Wires" J. Appl. Phys. (1993) 74(5):3162-3171.

Huang, Y. et al., "Directed Assembly of One-Dimensional Nanostructures into Functional networks" Science (2001) 291:630-633.

Huang, Y. et al., "Logic Gates and Computation from Assembled Nanowire Building Blocks" Science (2001) 294:1313-1317.

Jun, Y-W. et al. "Controlled synthesis of multi-armed CdS nanorod architectures using monosurfactant system" J. Am. Chem. Soc. (2001) 123:5150-5151.

Kong, J. et al., "Synthesis of individual single-walled carbon nanotubes on patterned silicon wafers" Nature (1998) 395:878-881.

Kong, J. et al., "Chemical vapor deposition of methane for single-walled carbon nanotubes" Chem. Phys. Lett.(1998) 292:567-574.

Kong, J. et al., "Nanotube molecular wires as chemical sensors" Science (2000) 287:622-625.

Liu, C. et al. "Sol-Gel Synthesis of Free-Standing Ferroelectric Lead Zirconate Titanate Nanoparticles" J. Am. Chem. Soc. (2001) 123:4344-4345.

Manalis, S.F. et al., "Microvolume field-effect pH sensor for the scanning probe microscope" Applied Phys. Lett. (2000) 76:1072-1074.

Manna, L. et al. "Synthesis of Soluble and Processable Rod-,Arrow-, Teardrop-, and Tetrapod-Shaped CdSe Nanocrystals" J. Am. Chem. Soc. (2000) 122:12700-12706.

Manna, L. et al. "Epitaxial growth and photochemical annealing of graded CdS/ZnS shells on colloidal CdSe nanorods" J. Am. Chem. Soc. (2002) 124:7136-7145.

Morales, A.M. et al. "A laser ablation method for the synthesis of crystalline semiconductor nanowires" Science (1998) 279:208-211.

Peng, X et al. "Epitaxial growth of highly luminescent CdSe/CdS core/shell nanocrystals with photostability and electronic accessibility" J. Am. Chem. Soc. (1997) 119:7019-7029.

Peng, X. et al. "Shape Control of CdSe Nanocrystals" Nature (2000) 404:59-61.

Puntes, V.F. et al. "Colloidal nanocrystal shape and size control: The case of cobalt" Science (2001) 291:2115-2117.

Schon J.H. et al., "Field-effect modulation of the conductance of single molecules" Science (2001) 294:2138-2140.

Schon, J.H. et al., "Self-assembled monolayer organic field-effect transistors" (2001) Nature 413:713-716.

Service, R.F., "Assembling nanocircuits from the bottom up" Science (2001) 293:782-785.

Tang, et al., "Synthesis of InN Nanowires Using a Two-Zone Chemical Vapor Deposition Approach" IEEE (Aug. 14, 2003) 205-207.

Tans, S.J. et al., "Room-temperature transistor based on a single carbon nanotube" Nature (1998) 393:49-52.

Thess, A. et al., "Crystalline ropes of metallic carbon nanotubes" (1996) Science 273:483-486.

Tseng, G.Y. et al., "Toward nanocomputers" (2001) Science 294:1293-1294.

Urban, J.J. et al. "Synthesis of single-crystalline perovskite nanowires composed of barium titanate and strontium titanate" J. Am. Chem. Soc. (2002) 124(7):1186-1187.

Wagner, R.S. et al., "Vapor-Liquid-Solid mechanism of single crystal growth" Appl. Phys. Lett. (1964) 4(5):89-90.

Wang et al., "Low Temperature Synthesis of Single-Crystal Germanium Nanowires by Chemical Vapor Deposition" Angew. Chem. Int. Ed. (2002) 41(24):4783-4786.

Wu, Y et al. "Block-by-block growth of single-crystalline Si/SiGe superlattice nanowires" Nano Letters (2002) 2(2):83-86.

Yamada, T. "Analysis of submicron carbon nanotube field-effect transistors" Appl. Phys Letts (2000) 76(5):628-630.

Yazawa, M. et al. "Semiconductor nanowhiskers" Adv. Mater.(1993) 5(7/8):577-580.

Yun, W.S. et al. "Ferroelectric Properties of Individual Barium Titanate Nanowires Investigated by Scanned Probe Microscopy" Nanoletters (2002) 2(5):447-450.

* cited by examiner

300

FIG. 5D
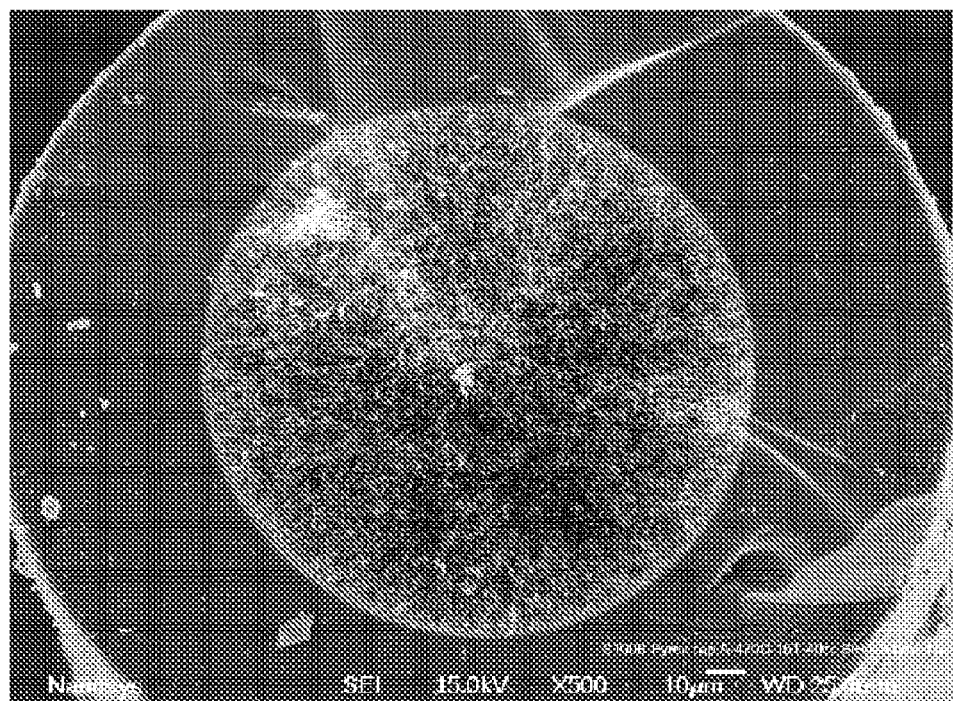
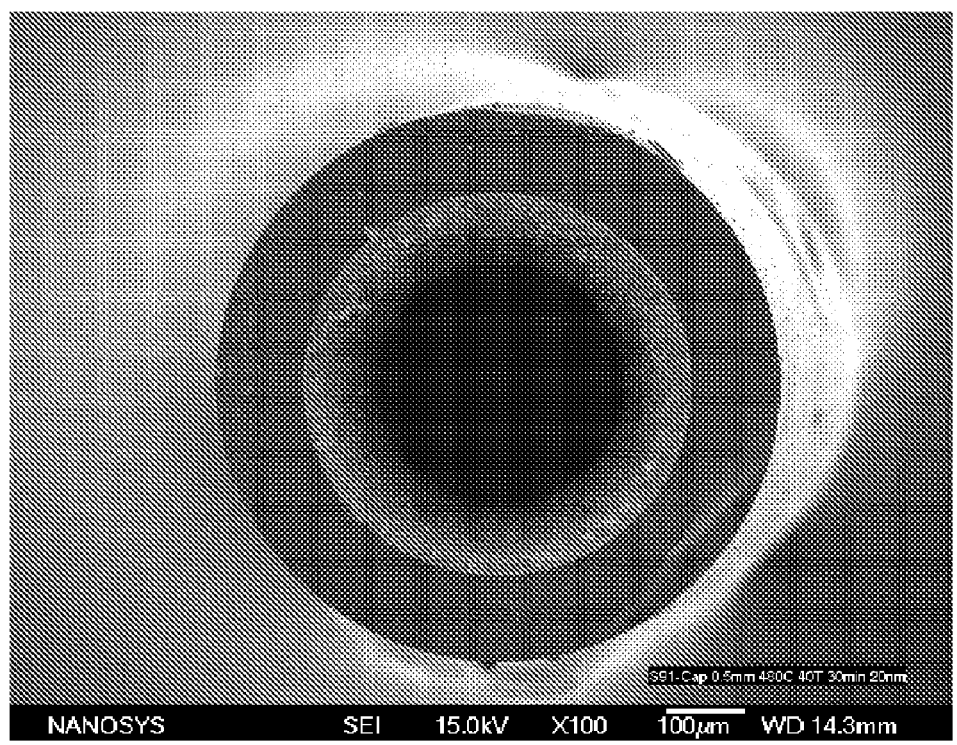
FIG. 5E

SYSTEMS AND METHODS FOR NANOWIRE GROWTH AND MANUFACTURING

CROSS REFERENCE TO RELATED APPLICATIONS

This application is a divisional of U.S. patent application Ser. No. 11/103,642, filed Apr. 12, 2005, now abandoned, which claims the benefit of priority to U.S. Provisional Patent Application, Application No. 60/566,602, filed Apr. 30, 2004, which is incorporated herein by reference in its entirety.

BACKGROUND OF THE INVENTION

1. Field of Invention

The present invention relates to nanowires, and more particularly, to nanowire manufacturing.

2. Background of the Invention

Nanowires have the potential to facilitate a whole new generation of electronic devices. A major impediment to the emergence of this new generation of electronic devices based on nanowires is the ability to mass produce nanowires that have consistent characteristics. Current approaches to produce nanowires are often done manually and do not yield consistent nanowire performance characteristics.

What are needed are compositions of matter, systems, and methods to cost effectively manufacture nanowires.

SUMMARY OF THE INVENTION

Compositions of matter, systems, and methods to manufacture nanowires are provided. In one aspect of the invention, a buffer layer is placed on a nanowire growth substrate. The buffer layer can then be treated, for example, by boiling it in water. Catalytic nanoparticles are then placed on the treated buffer layer to form a catalytic-coated nanowire growth substrate. In an embodiment, nanowires can then be grown on the catalytic-coated nanowire growth substrate. In embodiments, various compositions of matter are provided that include a nanowire growth substrate, a buffer layer and catalytic nanoparticles that use a wide range of materials for the substrate, buffer layer, and catalytic nanoparticles. In other embodiments, compositions of matter are provided that include a nanowire growth substrate, a buffer layer, and nanowires or nanoribbons with catalytic particles at one end of the nanowire or nanoribbons. Methods to produce and use these compositions of matter are provided.

In a further embodiment, a nanowire growth system is provided. The nanowire growth system includes a roller that provides for continuous and semi-continuous production of nanowires. In an embodiment, the roller advances through a catalyst spray dispenser, a plasma cleaner, a nanowire growth chamber and a nanowire harvest sonicator. In one example, the roller is an $Al_2O_3$ foil.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIG. 5D is a SEM photo of Si nanowire growth substrates with $Al_2O_3$ buffer layers within a quartz capillary with full grown Si nanowires, according to an embodiment of the invention.

FIG. 5E is a SEM photo of Si nanowire growth substrates with $Al_2O_3$ buffer layers within a quartz capillary with partially grown Si nanowires, according to an embodiment of the invention.

DETAILED DESCRIPTION OF THE INVENTION

Figure 1A:
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein.

Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2 (S, Se, Te)_3$, $Al_2CO$, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom", etc.) made herein are for purposes of illustration only, and that devices of the present invention can be spatially arranged in any orientation or manner.

Types of Nanowires and their Synthesis

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
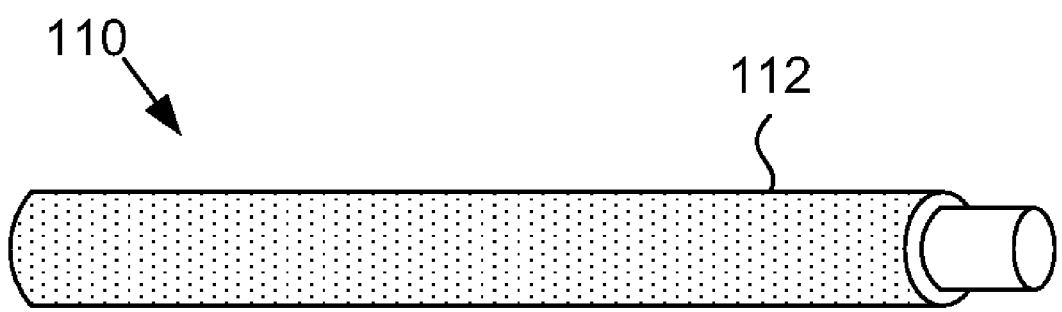
FIG. 1B is a diagram of a nanowire doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "Synthesis of Soluble and Processable Rod-, Arrow-, Teardrop-, and Tetrapod-Shaped CdSe Nanocrystals" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413, 489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "Epitaxial growth and photochemical annealing of graded CdS/ZnS shells on colloidal CdSe nanorods" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Buffer Layer on a Nanowire Growth Substrate and Methods of Use

Catalytic nanoparticles deposited on a nanowire growth substrate are used to promote nanowire growth. Unfortunately, often the nanowire growth structure and catalytic nanoparticles are negatively charged. For example, Au catalytic nanoparticles and an $SiO_2$ coated Si nanowire growth substrate both are negatively charged. Therefore a buffer coating, which brings positive charges to the nanowire growth surface is needed for the nanoparticles to effectively adhere to the surface. Several alternative processes exist for attaching small molecules to a nanowire growth substrate. However, these approaches are often tedious, difficult to control impurity levels, and lead to agglomeration of the catalytic nanoparticles. Similar shortcomings and challenges arise when different substrate materials and catalyst particles are used, as would be known by individuals skilled in the relevant arts. Method 200 described below provides an alternative approach that addresses these shortcomings. Method 200 describes a process using a buffer layer to address these shortcomings.

Figure 2:
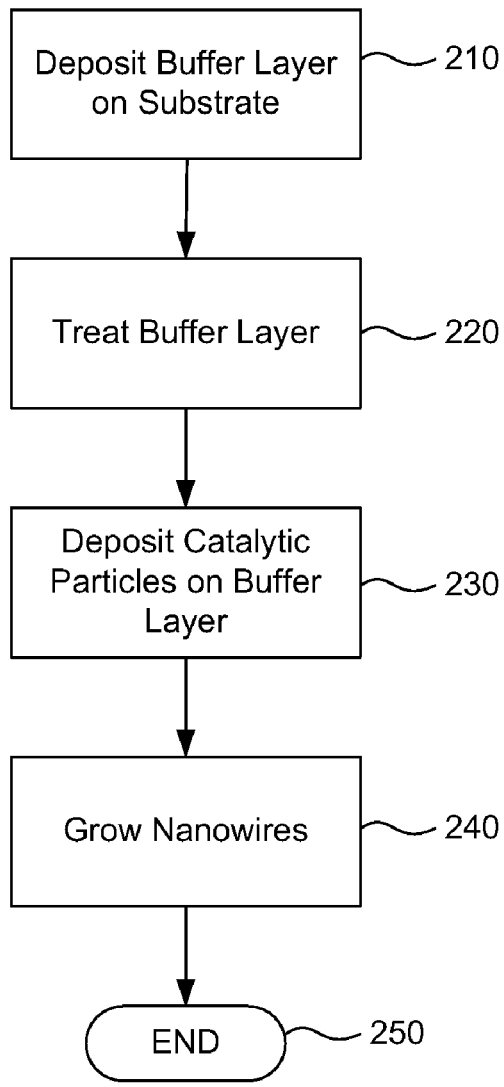
FIG. 2 is a flowchart of a method for growing nanowires using a catalytic-coated nanowire growth substrate, according to an embodiment of the invention.

FIG. 2 is a flowchart of method 200 for growing nanowires using a catalytic-coated nanowire growth substrate, according to an embodiment of the invention. Method 200 begins in step 210. In step 210, a buffer layer is deposited on a nanowire growth substrate. The buffer layer provides a charged surface that attracts catalyst particles. Additionally, the buffer layer provides a protection layer that can prevent reactions between a nanowire growth substrate and catalyst particles. In embodiments, the nanowire growth substrate can include, but is not limited to, one of the following types of materials: semiconductors, metals, ceramics, glass, and plastics. These materials can be in a variety of forms including wafers, thin sheets or foils, blocks, tubes with various inner diameters and foams with various cell sizes. In embodiments, various types of deposition techniques can be used to deposit the buffer layer on the nanowire growth substrate including, but not limited to oxidation, nitridation, chemical vapor deposition (CVD), plasma enhanced chemical vapor deposition (PECVD), sputtering, spraying, dip coating, e-beam evaporation, spin coating and roll-to-roll coating. In embodiments the buffer layer can include, but is not limited to one of the following materials: $Al_2O_3$, $SiO_2$, $TiO_2$, $ZrO_2$, MgO, or ZnO.

In step 220 the buffer layer is treated to enhance interactions between the buffer layer and catalytic particles, which will be deposited on the buffer layer in a subsequent step. In embodiments, the buffer layer can be treated by boiling the buffer layer in water, stream treating the buffer layer, providing an acid treatment of the buffer layer, providing a base treatment of the buffer layer and/or performing surface functionalization of the buffer layer. In other embodiments, the buffer layer may not be treated.

In step 230 catalytic nanoparticles are deposited on the buffer layer. In embodiments the catalytic nanoparticles can include, but are not limited to one of the following materials: Au, Pt, Pd, Cu Al, Ni, Fe, an Au alloy, a Pt alloy, a Pd alloy, a Cu alloy, an Al alloy, a Ni alloy or an Fe alloy. In embodiments, the catalytic nanoparticles can be deposited through charge induced self assembly, chemical functional group assembly, spin coating or dip coating.

In step 240 nanowires are grown as will be known by individuals skilled in the relevant arts based on the teachings herein. In step 250 method 200 ends.

Figure 3A:
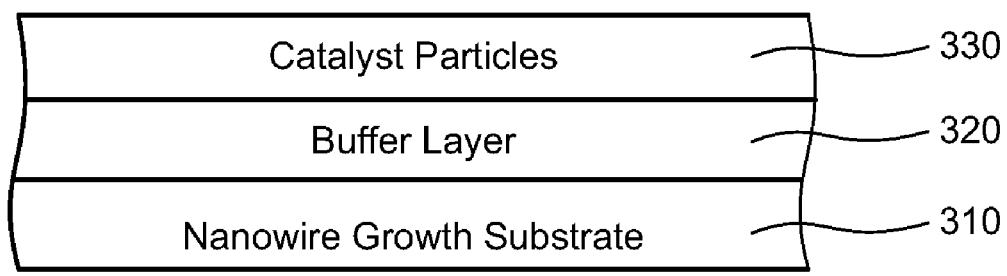
FIG. 3A is a diagram of a catalytic-coated nanowire growth substrate on a planar surface, according to an embodiment of the invention.

FIG. 3A is a diagram of catalytic-coated nanowire growth substrate 300 on a planar surface, according to an embodiment of the invention. In an embodiment catalytic-coated nanowire growth substrate 300 can be produced using method 200 above through step 230. Catalytic-coated nanowire growth substrate 300 includes nanowire growth substrate 310, buffer layer 320 and layer of catalyst particles 330. Nanowire growth substrate 310 forms the foundation of catalytic-coated nanowire growth substrate 300. In embodiments nanowire growth substrate 310 can include, but is not limited to one of following materials: semiconductors, metals, ceramics, glass or plastic.

Buffer layer 320 is deposited on the surface of nanowire growth substrate 310. In embodiments buffer layer 320 can include, but is not limited to one of the following materials: $Al_2O_3$, $SiO_2$, $TiO_2$, $ZrO_2$, MgO, or ZnO. The buffer layer provides a charged surface that attracts catalyst particles. Additionally, the buffer layer provides a protection layer that prevents reactions between a substrate and catalyst particles.

Catalyst particles within layer of catalyst particles 330 are distributed on the surface of buffer layer 320. In embodiments layer of catalyst particles 330 can include, but is not limited to one of the following nanoparticles: Au, Pt, Pd, Cu Al, Ni, Fe, an Au alloy, a Pt alloy, a Pd alloy, a Cu alloy, an Al alloy, a Ni alloy or an Fe alloy.

Figure 3B:
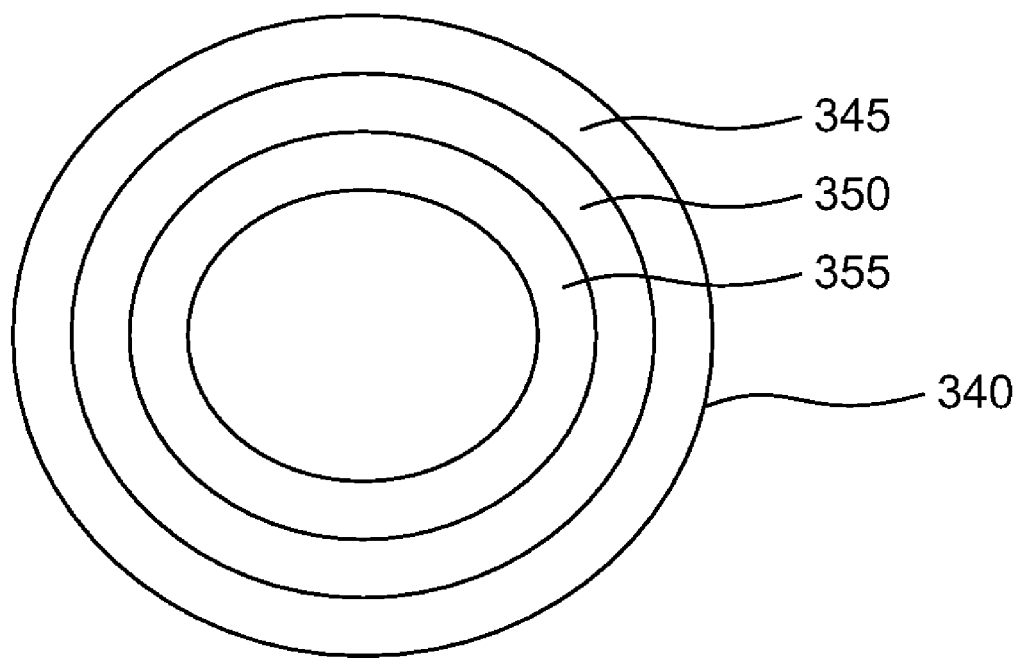
FIG. 3B is a diagram of a catalytic-coated nanowire growth substrate using a vessel, according to an embodiment of the invention.

FIG. 3B is a diagram of catalytic-coated nanowire growth substrate 335 using a vessel, according to an embodiment of the invention. Catalytic-coated nanowire growth substrate 335 includes vessel 340, nanowire growth substrate 345, buffer layer 350 and catalyst particles 355. Nanowire growth substrate 345 forms the foundation of the catalytic-coated nanowire growth substrate 335. Nanowire growth substrate 345 is placed within the interior of vessel 340. Example materials contained within nanowire growth substrate 345 can include, but are not limited to metals, semiconductors, plastics, ceramics, or glass.

Buffer layer 350 is deposited on the surface of nanowire growth substrate 345. In embodiments buffer layer 320 can include, but is not limited to one of the following materials: $Al_2O_3$, $SiO_2$, $TiO_2$, $ZrO_2$, MgO, or ZnO.

Catalyst particles 355 are distributed on the surface of buffer layer 350. Catalyst particles 355 can include, but is not limited to one of the following types of nanoparticles: Au, Pt, Pd, Cu Al, Ni, Fe, an Au alloy, a Pt alloy, a Pd alloy, a Cu alloy, an Al alloy, a Ni alloy or an Fe alloy.

Figure 3C:
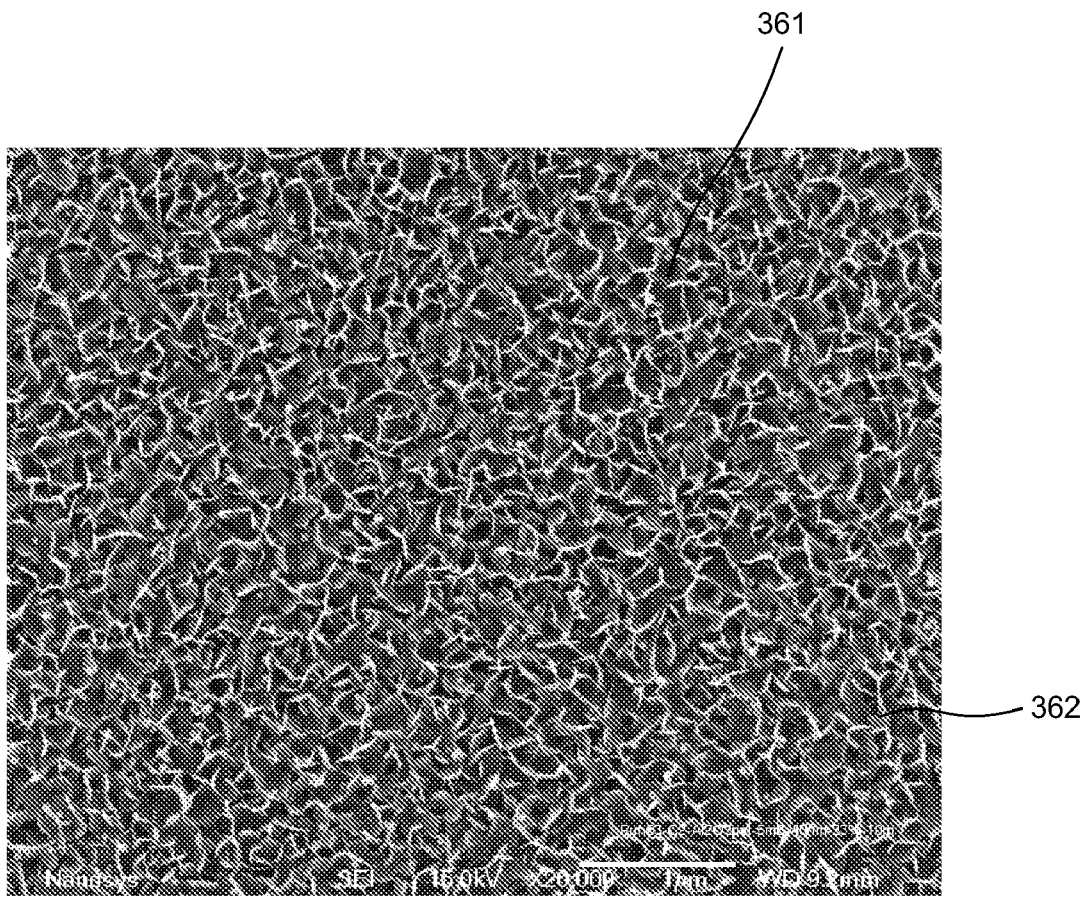
FIG. 3C is a scanning electron microscope (SEM) photo of a nanowire growth substrate with an $Al_2O_3$ buffer layer and Au catalytic nanoparticles, according to an embodiment of the invention.

FIG. 3C is a scanning electron microscope (SEM) photo of a Si nanowire growth substrate with a nanostructured $Al_2O_3$ buffer layer and 40 nm diameter Au catalytic nanoparticles, according to an embodiment of the invention. The photo illustrates the Au nanoparticles, such as Au nanoparticle 361, which are the light colored dots shown throughout the photo. The photo also illustrates the textured $Al_2O_3$ buffer layer, such as $Al_2O_3$ texture 362, which are the light colored elongated images throughout the photo.

Figure 3D:
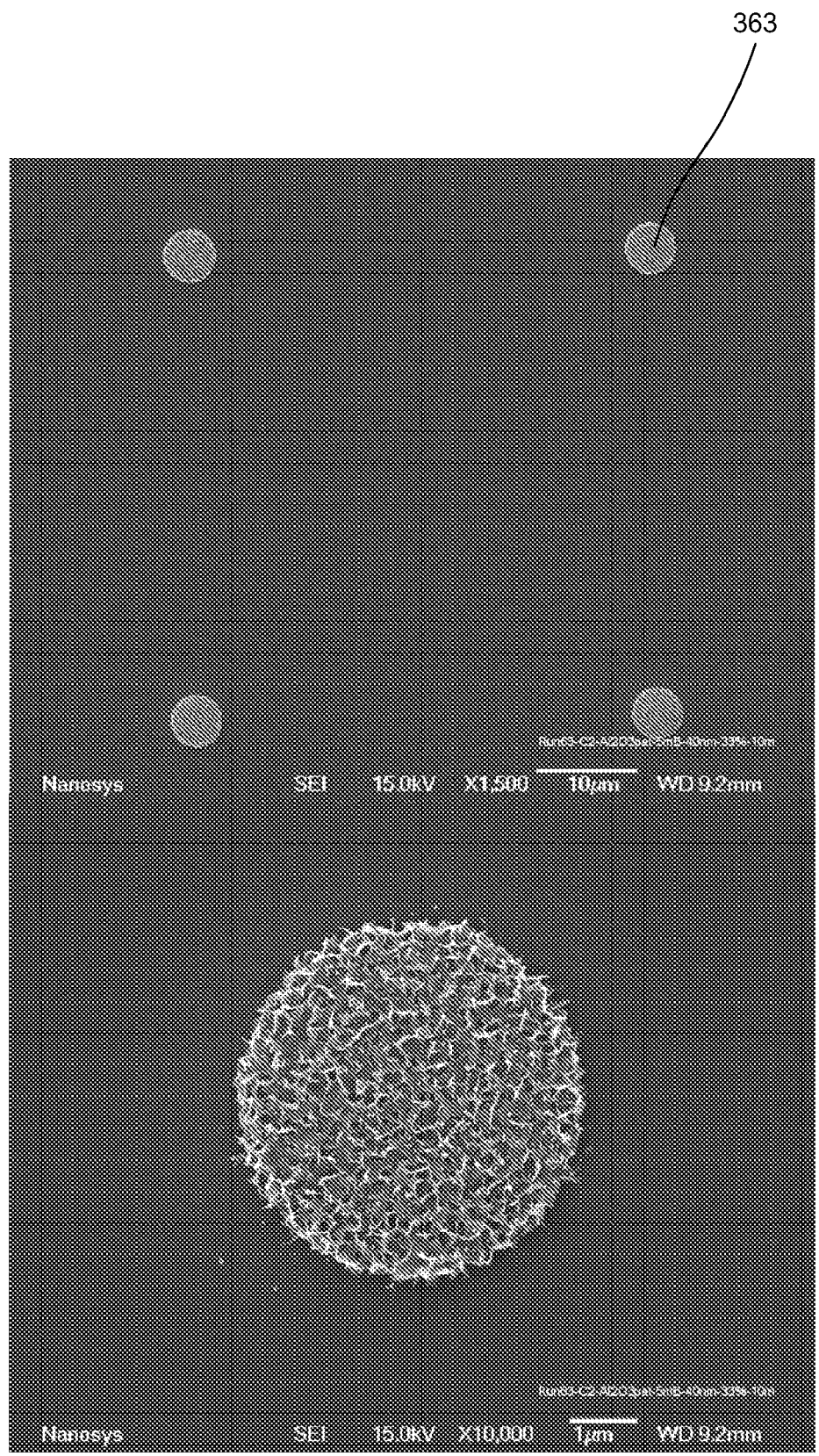
FIG. 3D is a set of SEM photos at different magnifications of a nanowire growth substrate with an $Al_2O_3$ buffer layer and Au catalytic nanoparticles where the Au catalytic nanoparticles are arranged in a dot pattern, according to embodiments of the invention.

FIG. 3D is a set of SEM photos at different magnifications of a nanowire growth substrate with an $Al_2O_3$ buffer layer and Au catalytic nanoparticles, where the Au catalytic nanoparticles are arranged in a dot pattern, according to embodiments of the invention. Specifically, the upper photo shows a silicon substrate with a $Al_2O_3$ dot pattern in which 5 mm diameter nanostructured dot patterns of 40 nm Au nanoparticles are spaced 40 mm apart. In this photo, circular patterns of $Al_2O_3$ are used, such as $Al_2O_3$ dot 363. In other embodiments, the Au nanoparticles can be structured in squares, rectangles, triangles or other structures. The patterning of the $Al_2O_3$ or other buffer layer materials can be selected based on the application, and the type of nanowires that need to be grown. The lower photo provides a photo of one of the dot patterns at a higher magnification.

Figure 4A:
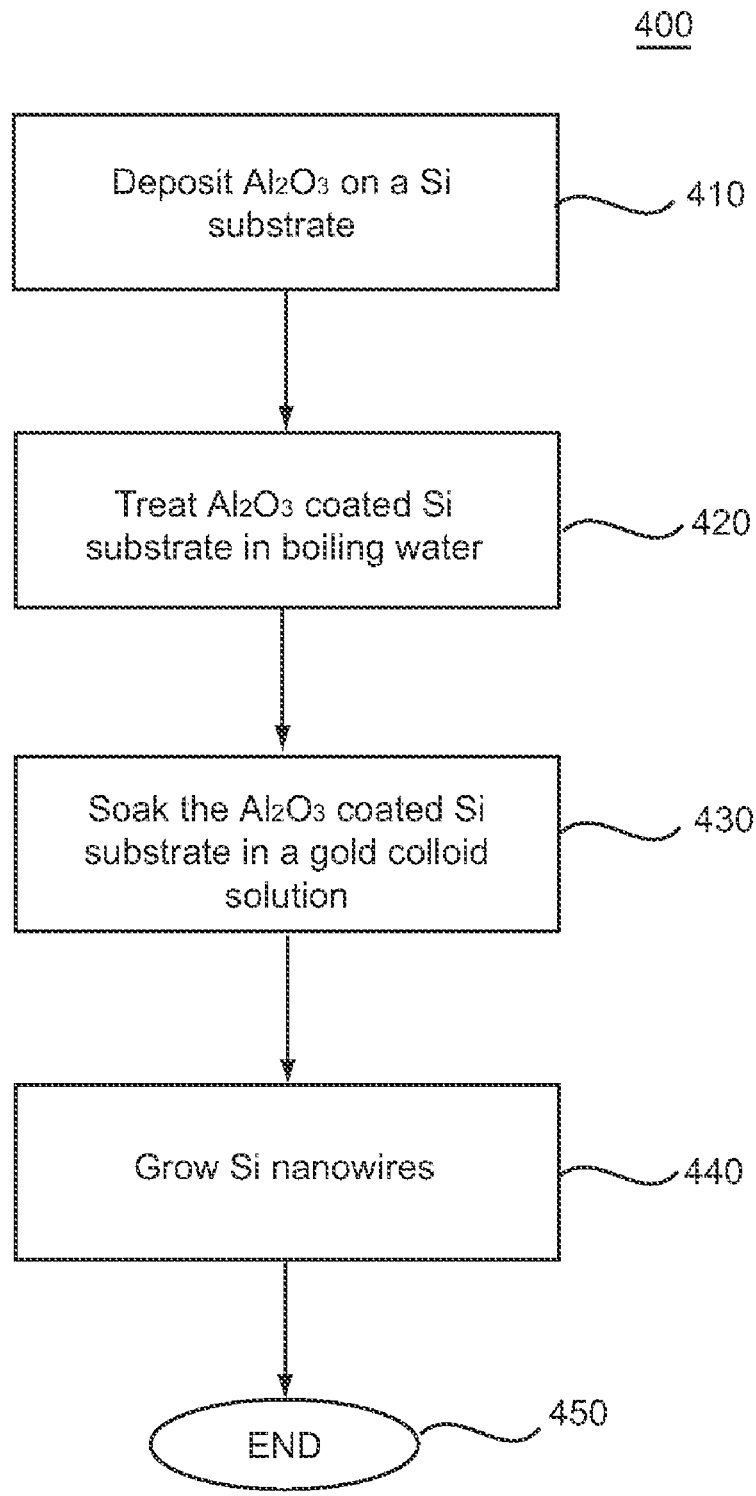
FIG. 4A is a flowchart of a method for growing Si nanowires using a catalytic-coated nanowire growth substrate with an $Al_2O_3$ buffer layer, according to an embodiment of the invention.

FIG. 4A is a flowchart of method 400 for growing Si nanowires using a catalytic-coated nanowire growth substrate, according to an embodiment of the invention. Method 400 represents one embodiment of Method 200. Method 400 begins in step 410. In step 410, in an embodiment an $Al_2O_3$ coating is deposited on a nanowire growth substrate. In an embodiment, e-beam evaporation can be used to deposit $Al_2O_3$ with high purity levels.

In embodiments, in laboratory tests the thickness of the $Al_2O_3$ coating has ranged from 5 to 70 nanometers. These ranges are provided as exemplary and not intended to limit the invention. In step 420 the $Al_2O_3$ coated nanowire growth substrate is treated in boiling water. The treatment with boiling water induces crystallization, highlights grain boundaries and introduces —OH groups on the surface of the $Al_2O_3$ coating.

In step 430, the $Al_2O_3$ coated nanowire growth substrate is soaked in a colloid solution. The colloid can be Au, but is not limited to Au. The density of the gold particles can be controlled by varying the concentration of gold colloid solution, and soaking time.

In laboratory tests analysis of SEM images were used to gather information on the distribution, density and morphology of gold particles on substrates. The results showed that distribution of gold particles on the substrate was quite uniform. For example, for 40 nanometer diameter gold particles, the density of gold particles can be controlled to be between 2 and 35 particles/$\mu m^2$. Significantly, more than 90% of the gold particles were singles (i.e., the gold particles were not agglomerated).

In step 440 nanowires are grown on the $Al_2O_3$ coated substrate with colloid particles distributed over the surface. Methods of growth will be known to individuals skilled in the relevant arts based on the teachings herein. In step 450 method 400 ends.

Figure 4B:
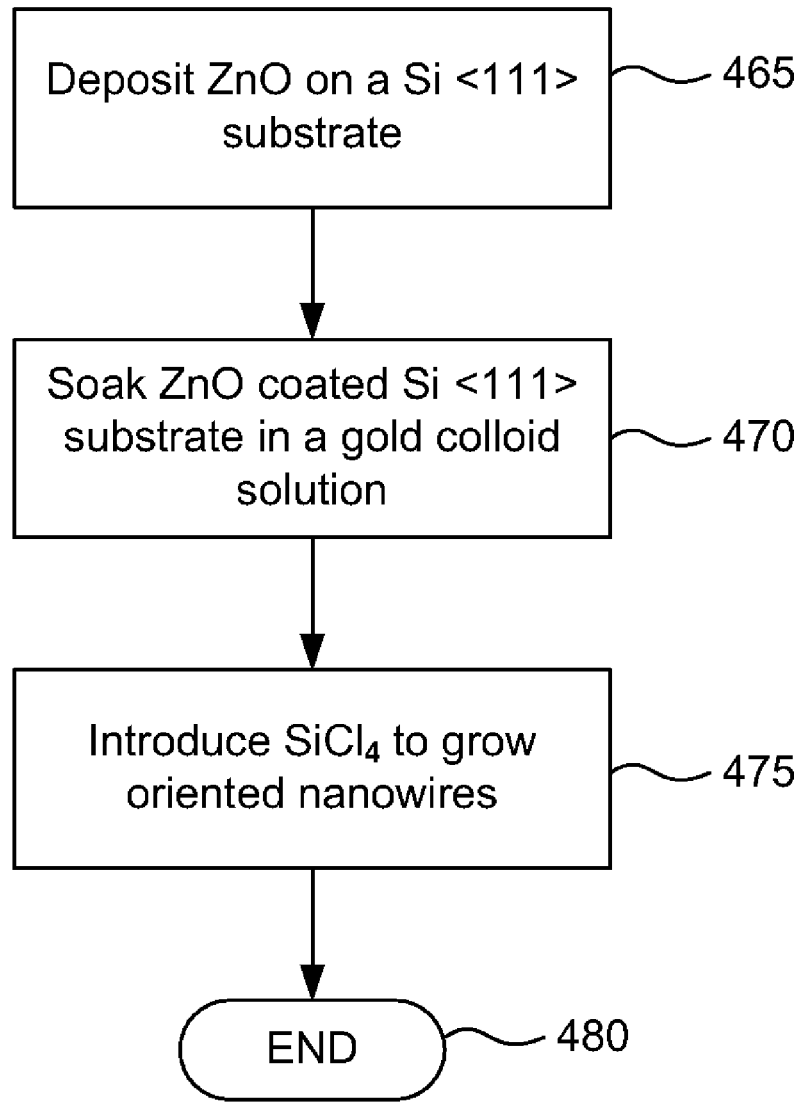
FIG. 4B is a flowchart of a method for growing oriented Si nanowires using a catalytic-coated nanowire growth substrate with a ZnO buffer layer, according to an embodiment of the invention.

FIG. 4B is a flowchart of method 460 for growing oriented Si nanowires using a catalytic-coated nanowire growth substrate with a ZnO buffer layer, according to an embodiment of the invention. Method 460 is an embodiment of Method 200 that provides for oriented nanowire growth through the use of ZnO as the buffer layer.

Method 460 begins in step 465. In step 465 ZnO is deposited on a Si substrate in which the Si has Miller indices of <111>. As in Method 200, the substrate can be a variety of types of materials, and the Si can have different orientations. The ZnO buffer layer provides a charged surface that attracts catalyst particles. Additionally, the ZnO buffer layer facilitates epitaxial-oriented nanowire growth. In embodiments the ZnO layer is less than about 10 nm thick. In step 470 the ZnO coated Si <111> nanowire growth substrate is soaked in an Au colloid solution. In other embodiments Pt, Fe, Ti, Ga, or Sn nanoparticles can be used, for example.

In step 475, SiCl4 is introduced to stimulate the growth of oriented Si nanowires. In an alternative embodiments $SiH_2Cl_2$ or SiCl can also be used to stimulate nanowire growth. During nanowire growth the ZnO is etched by the Cl ions enabling the nanowires to align themselves with the Si <111> nanowire growth substrate surface, thereby providing for the growth of oriented Si nanowires. In step 480, method 400 ends.

Figure 5A:
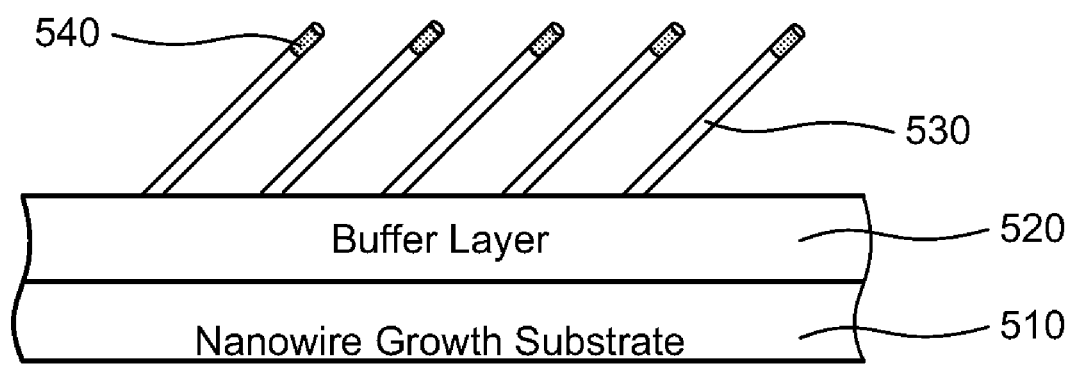
FIG. 5A is a diagram of a nanowire growth substrate with nanowires, according to an embodiment of the invention.

FIG. 5A is a diagram of nanowire growth substrate with nanowires 500, according to an embodiment of the invention. Catalytic-coated nanowire growth substrate 500 includes nanowire growth substrate 510, buffer layer 520, nanowires 530 and catalytic nanoparticles 540. Nanowire growth substrate 510 forms the foundation of catalytic-coated nanowire growth substrate 500. In embodiments nanowire growth substrate 510 can include, but is not limited to one of following materials: semiconductors, metals, ceramics, glass or plastic.

Buffer layer 520 is applied on the surface of nanowire growth substrate 510. In embodiments buffer layer 520 can include, but is not limited to one of the following materials: $Al_2O_3$, $SiO_2$, $TiO_2$, $ZrO_2$, MgO, or ZnO. The buffer layer provides a charged surface that attracts catalyst particles. Additionally, the buffer layer provides a protection layer that prevents reactions between a substrate and catalyst particles.

Nanowires, such as nanowire 530, extend out of the surface of buffer layer 520 or in the case of an Al nanowire growth substrate directly out of the Al nanowire growth substrate. The nanowires can include, but are not limited to one of the following: Si, Ge, $Si_{x-1}Ge_x$, GaN, GaAs, InP, SiC, CdS, CdSe, ZnS or ZnSe. In an embodiment, nanowires, such as nanowire 530 will have catalytic particles, such as catalytic particle 540 at one of their ends. The material of catalytic particle 540 can be, but is not limited to one of the following types of nanoparticles: Au, Pt, Pd, Cu Al, Ni, Fe, an Au alloy, a Pt alloy, a Pd alloy, a Cu alloy, an Al alloy, a Ni alloy or an Fe alloy. In embodiments, the nanowires can be grown perpendicular, at a preferred angle, or with a random orientation to the nanowire growth substrate. Additionally, in embodiments the nanowires can be grown with various wire diameters and lengths.

Figures 5B, 5C:
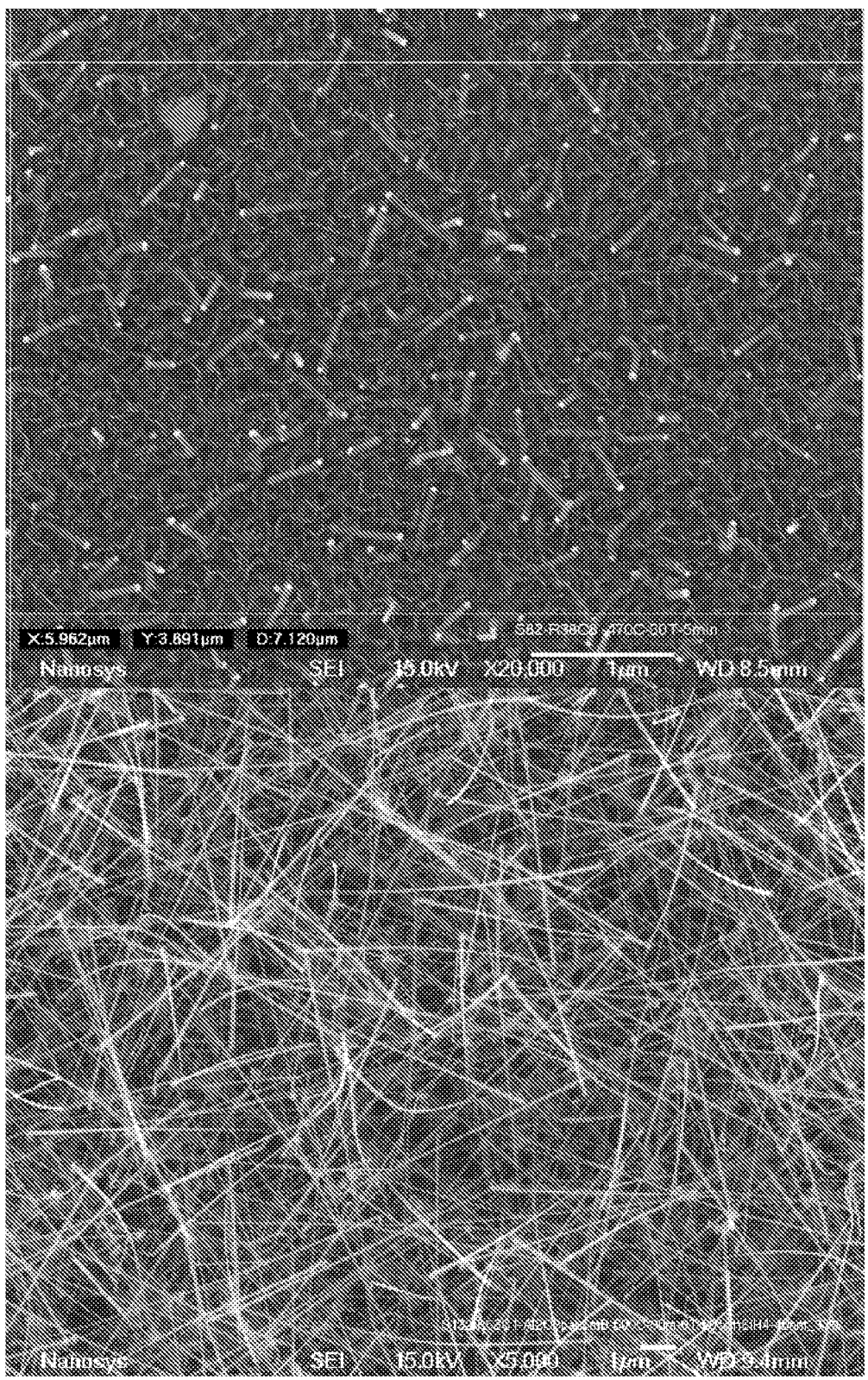
FIG. 5B is a scanning electron microscope ("SEM") photo of a Si nanowire growth substrates with $Al_2O_3$ buffer layers with short Si nanowires, according to an embodiment of the invention.
FIG. 5C is a SEM photo of a Si nanowire growth substrates with $Al_2O_3$ buffer layers with long Si nanowires, according to an embodiment of the invention.

FIG. 5B is a SEM photo of a Si nanowire growth substrates with $Al_2O_3$ buffer layers with short Si nanowires, according to an embodiment of the invention. FIG. 5C is a SEM photo of a Si nanowire growth substrates with $Al_2O_3$ buffer layers with long Si nanowires, according to an embodiment of the invention. FIGS. 5B and 5C provide actual images of an embodiment of nanowire growth substrate with nanowires 500 that was provided in FIG. 5A.

FIG. 5D is a SEM photo of Si nanowire growth substrates with $Al_2O_3$ buffer layers within a quartz capillary with full grown Si nanowires, according to an embodiment of the invention. FIG. 5E is a SEM photo of Si nanowire growth substrates with $Al_2O_3$ buffer layers within a quartz capillary with partially grown Si nanowires, according to an embodiment of the invention. FIGS. 5D and 5E provide actual images of an embodiment of nanowire growth substrate with nanowires 500 that was provided in FIG. 5A. In both FIGS. 5C and 5D, a nanostructured $Al_2O_3$ buffer layer was used to grow Si nanowires. The nanowires have a diameter of about 40 nm. In this case, however, the nanowire growth substrate is provided within a quartz capillary in an arrangement as was illustrated in FIG. 3B.

Figures 5F, 5G:
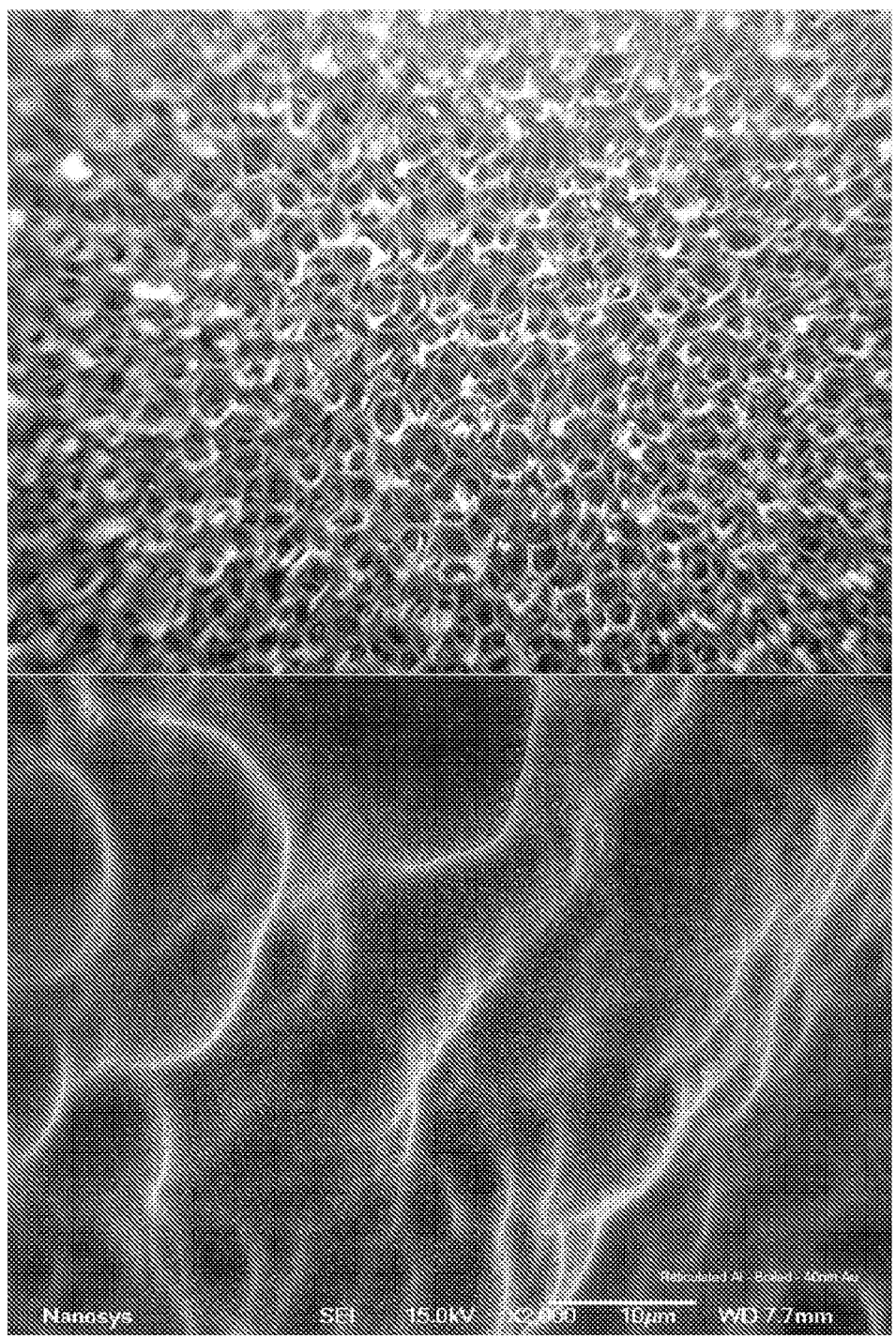
FIG. 5F is a SEM photo of a foam surface with a reticulated aluminum foam structure.
FIG. 5G is a SEM photo of a reticulated aluminum foam structure coated with Si nanowires, according to an embodiment of the invention.

FIG. 5F is a SEM photo of a foam surface with a reticulated aluminum foam structure. FIG. 5G is a SEM photo of a reticulated aluminum foam structure coated with Si nanowires, according to an embodiment of the invention.

Roll-to-Roll Continuous Nanowire Synthesis

Figure 6:
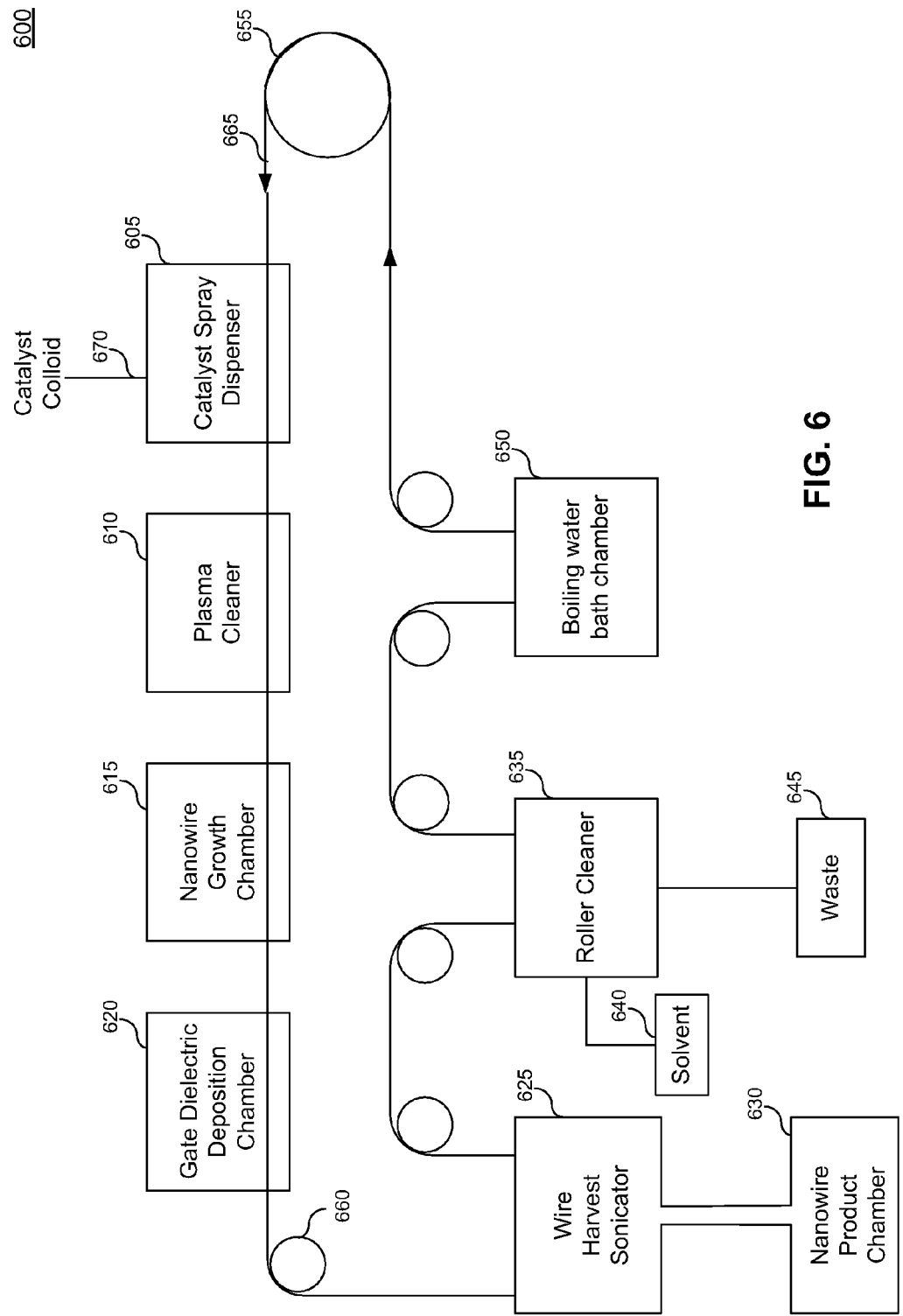
FIG. 6 is a diagram of a nanowire growth system, according to an embodiment of the invention.

FIG. 6 is a diagram of nanowire growth system 600, according to an embodiment of the invention. Nanowire growth system 600 includes catalyst spray dispenser 605, plasma cleaner 610, nanowire growth chamber 615, gate dielectric deposition chamber 620, nanowire harvest sonicator 625, roller cleaner 635 and boiling water bath chamber 650. Roller 665 couples each of these elements to each other. Spindles, such as spindles 655 and 660, drive roller 665. Additionally, wire harvest sonicator 625 includes a nanowire product chamber 630, and roller cleaner 635 includes solvent dispenser 640 and waste removal chamber 645.

Nanowire growth system 600 can operate in a continuous or semi-continuous mode to produce nanowires. Nanowire growth system 600 provides greater throughput of nanowires and greater control of nanowire product than current wafer based methods of producing nanowires. In an embodiment, roller 665 is an aluminum foil. Nanowire growth system 600 produces nanowires by growing nanowires on an aluminum foil roller, such as roller 665 and transferring the roller through different chambers as the growth of the nanowires progress.

For example, in an embodiment catalyst spray dispenser 605 sprays Au colloid on an aluminum foil roller, such as roller 665, to stimulate nanowire growth. Spindles, such as spindles 655 and 660, advance roller 665 to the next stage in the system, which is plasma cleaner 610. Plasma cleaner 610 removes excess Au colloid solution and cleanses roller 665. Roller 665 advances to nanowire growth chamber 615, where nanowire growth occurs. Nanowire growth chamber 615 can, for example, use low pressure chemical vapor deposition (LP-CVD) or a pure gas phase chamber to grow nanowires. In embodiments, gas concentrations can be varied to change the desired characteristics of a nanowire, as would be known by individuals skilled in the relevant art based on the teachings herein.

Following nanowire growth chamber 615, roller 665 advances to gate dielectric deposition chamber 620. In gate dielectric deposition chamber 620, gate dielectrics are deposited on the nanowires that are affixed to the aluminum foil on roller 665. Once gate dielectrics are deposited, roller 665 advances the nanowires on roller 665 to wire harvest sonicator 625, where the nanowires are freed from roller 665 and deposited in nanowire product chamber 630. In an example, the nanowires on roller 665 are exposed to an ultrasound signal that releases the nanowires. A solution is contained within wire harvest sonicator that receives the released nanowires and transports them to nanowire product chamber 630.

Roller 665 continues to advance through nanowire growth system 600 to be cleaned in preparation for another round through the nanowire growth section of nanowire growth system 600. In particular, roller 665 advances through roller cleaner 635. In roller cleaner 635, a solvent is dispensed from solvent dispenser 640 to clean the roller. Waste products are removed from roller cleaner 635 and deposited in waste chamber 645. Roller 635 advances through roller cleaner 635 to boiling water bath chamber 650 where roller 635 is rinsed and boiled to prepare the roller for another round through the nanowire growth sections.

In an embodiment, roller 665 can move continuously through nanowire growth system 600. In another embodiment, roller 665 can move semi-continuously through growth system 600. Spindles, such as spindles 655 and 660, control the rate of movement of roller 665. In embodiments, the rate of movement of roller 665 can be varied based on the desired characteristics of the nanowires to be produced. For example, the rate of movement can be a function of the nanowire material, the type and level of doping, and the dimensions of the nanowires. In a continuous mode of operation the distance between elements, such as plasma cleaner 610 and nanowire growth chamber 615 can be varied to allow for time differences needed in the different portions of nanowire growth system 600.

Nanowire growth system 600 has been described using an embodiment in which an aluminum foil is used. However, the invention is not limited to the use of a aluminum foil roller. Other metal foils for the roller can be used, such as, but not limited to, stainless steel, titanium, nickel, and steel. Moreover, any type of metal foil with or without a buffer layer can be used provided that the foils or buffer layer is oppositely charged to the particular colloid that is being used.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A method to produce a catalytic-coated nanowire growth substrate for nanowire growth, comprising:
   (a) depositing a buffer layer on a substrate;
   (b) treating the buffer layer with boiled water or steam following the depositing in step (a) to enhance interactions between the buffer layer and catalyst particles; and
   (c) depositing catalytic particles on a surface of the buffer layer following the treating in step (b).

2. The method of claim 1, wherein the buffer layer provides a charged surface that attracts catalytic particles.

3. The method of claim 1, wherein the buffer layer provides a protection layer that prevents reactions between the substrate and catalytic particles.

4. The method of claim 1, wherein the buffer layer provides a protection layer that prevents chemical reactions between the substrate and catalytic particles.

5. The method of claim 1, wherein the substrate comprises a semiconductor, metal, ceramic, glass or plastic.

6. The method of claim 1, wherein the substrate is in a form of a wafer, foil, block, tube or foam.

7. The method of claim 1, wherein the buffer layer is $Al_2O_3$, $SiO_2$, $TiO_2$, $ZrO_2$, MgO or ZnO.

8. The method of claim 1, wherein step (a) comprises oxidation, nitridation, sputtering, spraying, dip coating, e-beam evaporation, spin coating, roll-to-roll coating, chemical vapor deposition, or plasma enhanced chemical vapor deposition to deposit the buffer layer on the substrate.

9. The method of claim 1, wherein step (b) treating the buffer layer comprises boiling the buffer layer in water.

10. The method of claim 1, wherein step (b) treating the buffer layer comprises steaming the buffer layer.

11. The method of claim 1, wherein step (c) comprises using charge induced self assembly, chemical functional group induced assembly, spin coating, or dip coating to deposit catalytic particles on the surface of the buffer layer.

12. A method to grow silicon nanowires, comprising:
 (a) depositing $Al_2O_3$ on a silicon substrate;
 (b) treating the $Al_2O_3$ coated substrate in boiling water following the depositing in step (a);
 (c) soaking the $Al_2O_3$ coated silicon substrate in a Au colloid solution following the treating in step (b); and
 (d) growing nanowires from the Au colloid particles deposited in step (c) above on the $Al_2O_3$ coated silicon substrate.

13. A method to grow oriented silicon nanowires, comprising:
 (a) depositing ZnO on a silicon substrate;
 (b) soaking the ZnO coated silicon substrate produced in step (a) in an Au colloid solution; and
 (c) growing oriented silicon nanowires.

14. The method of claim 13, wherein step (c) comprises introducing $SiCl_4$ to the ZnO coated Si substrate to grow oriented silicon nanowires.

15. The method of claim 13, wherein in step (a) the silicon substrate is a silicon <111> substrate.

* * * * *